United States Patent
Kamijima

(10) Patent No.: US 6,641,984 B2
(45) Date of Patent: Nov. 4, 2003

(54) METHOD OF FRAME PLATING AND METHOD OF FORMING MAGNETIC POLE OF THIN-FILM MAGNETIC HEAD

(75) Inventor: Akifumi Kamijima, Tokyo (JP)

(73) Assignee: TDK Corporation, Tokyo (JP)

( * ) Notice: Subject to any disclaimer, the term of this patent is extended or adjusted under 35 U.S.C. 154(b) by 176 days.

(21) Appl. No.: 09/842,689

(22) Filed: Apr. 27, 2001

(65) Prior Publication Data

US 2002/0048631 A1 Apr. 25, 2002

(30) Foreign Application Priority Data

May 16, 2000 (JP) ........................................ 2000-143017

(51) Int. Cl.$^7$ .............................. G11B 5/127; G03C 1/76
(52) U.S. Cl. ................... 430/320; 430/313; 430/270.1; 430/170; 430/905; 29/603.07; 29/603.16; 360/313
(58) Field of Search ................................. 430/320, 313, 430/270.1, 170, 905; 29/603.07, 603.16; 360/313

(56) References Cited

U.S. PATENT DOCUMENTS

| | | | | |
|---|---|---|---|---|
| 3,853,715 A | | 12/1974 | Romankiw | 204/15 |
| 6,106,993 A | * | 8/2000 | Watanabe et al. | 430/270.1 |
| 6,451,514 B1 | * | 9/2002 | Iitsuka | 430/320 |

FOREIGN PATENT DOCUMENTS

| | | |
|---|---|---|
| JP | B2 56-36706 | 8/1981 |
| JP | A 6-250379 | 9/1994 |
| JP | A 6-273934 | 9/1994 |
| JP | A 6-273935 | 9/1994 |
| JP | A 10-20504 | 1/1998 |
| JP | A 10-73927 | 3/1998 |
| JP | A 11-204399 | 7/1999 |
| JP | 2000-112150 A * | 4/2000 |

* cited by examiner

Primary Examiner—Mark F. Huff
Assistant Examiner—Daborah Chacko-Davis
(74) Attorney, Agent, or Firm—Oliff & Berridge PLC

(57) ABSTRACT

In the method of frame plating according to the invention, a first patterned resist layer is formed using a first resist containing a material generating an acid; the first patterned resist layer is coated with a second resist capable of entering into a crosslinking reaction in the presence of an acid; an acid is generated in the first patterned resist layer to form a crosslinked film in a portion of the second resist near the boundary that touches the first patterned resist layer; and the non-crosslinked portion of the second resist is peeled off to form a second patterned resist layer, thereby forming a frame. As the first resist, a chemically amplifying type positive material containing a base resin comprising a high molecular compound shown by a predetermined formula and having a weight average molecular weight of 10000 to 25000 and a molecular weight distribution of as narrow as 1.05 to 1.25 is used.

6 Claims, 14 Drawing Sheets

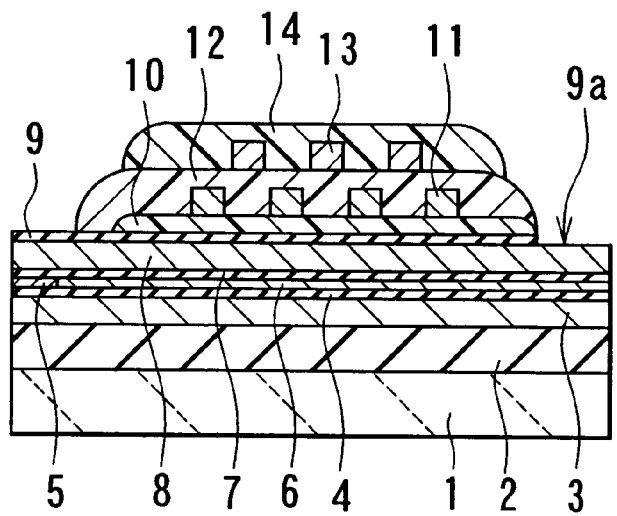
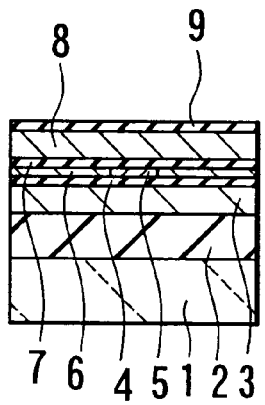
FIG. 12A
FIG. 12B
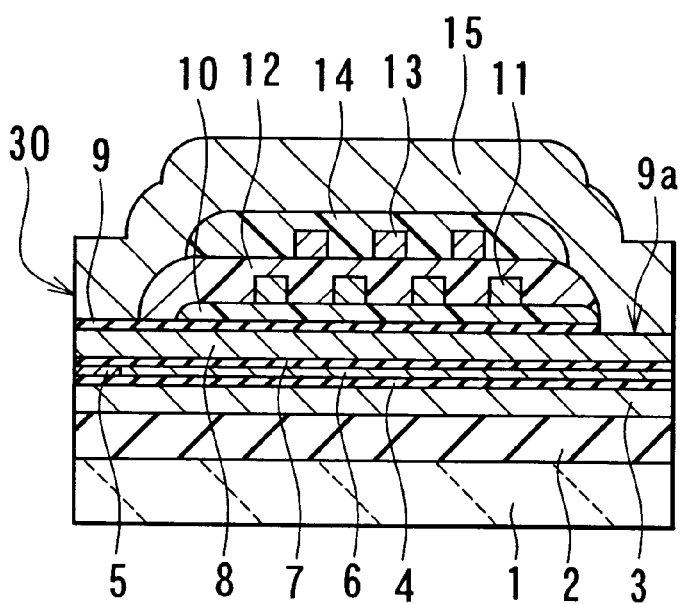
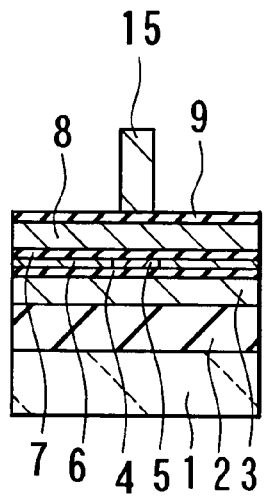
FIG. 13A
FIG. 13B

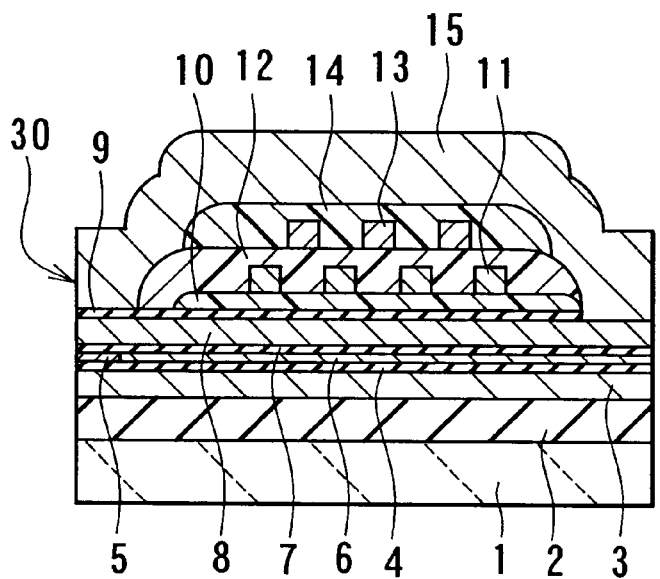 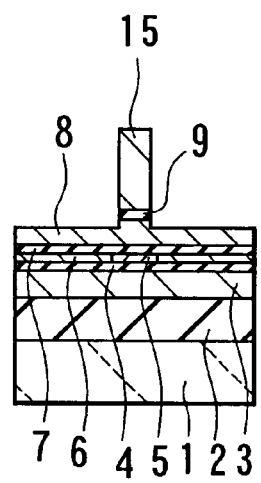
FIG. 14A    FIG. 14B
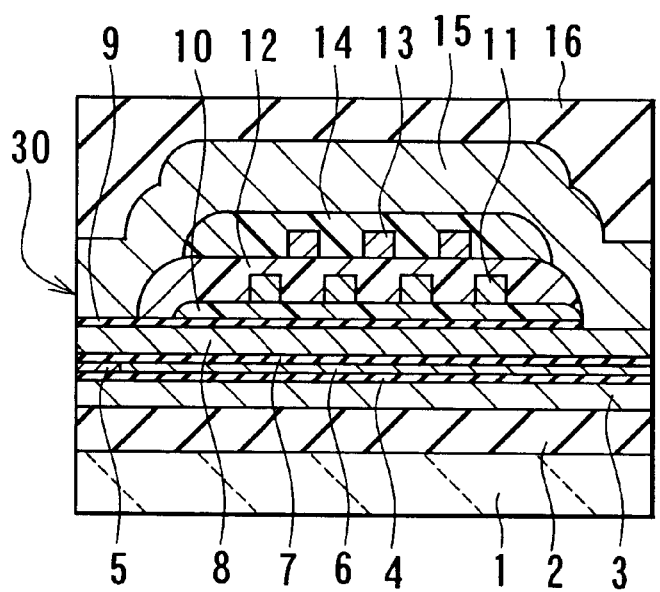 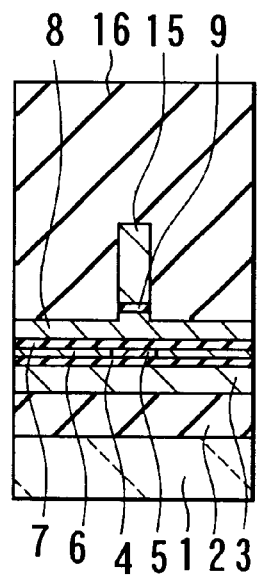
FIG. 15A    FIG. 15B

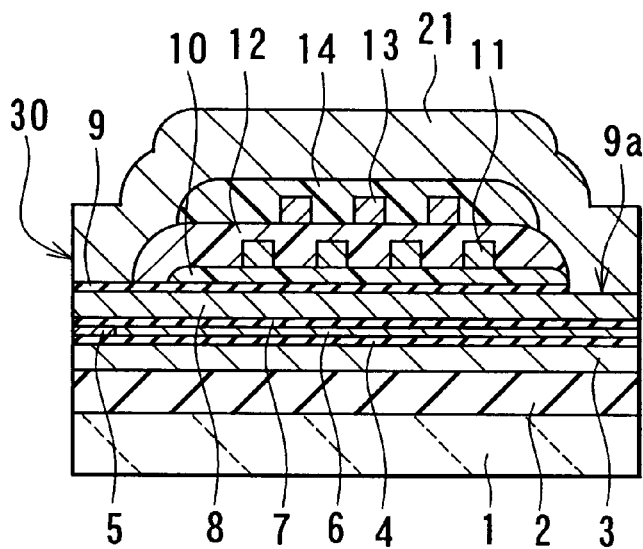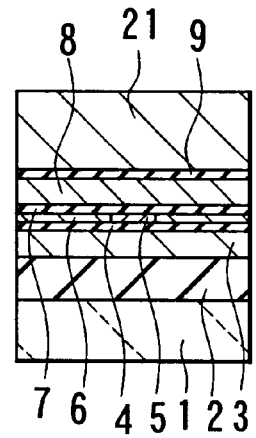
FIG. 16A  FIG. 16B
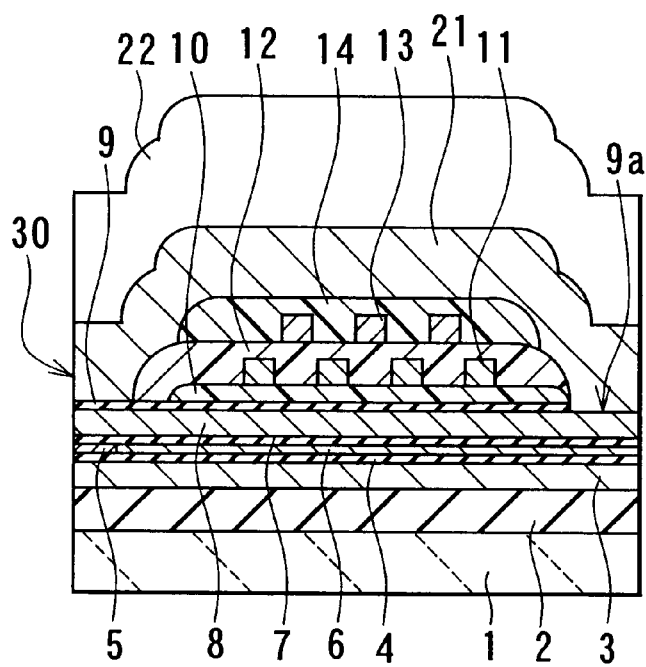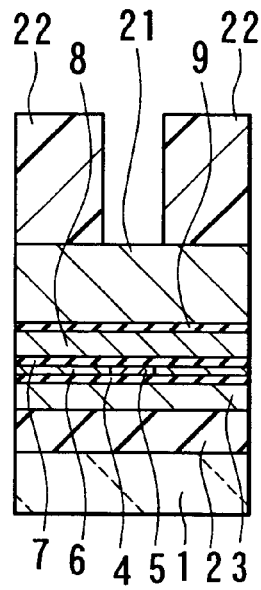
FIG. 17A  FIG. 17B

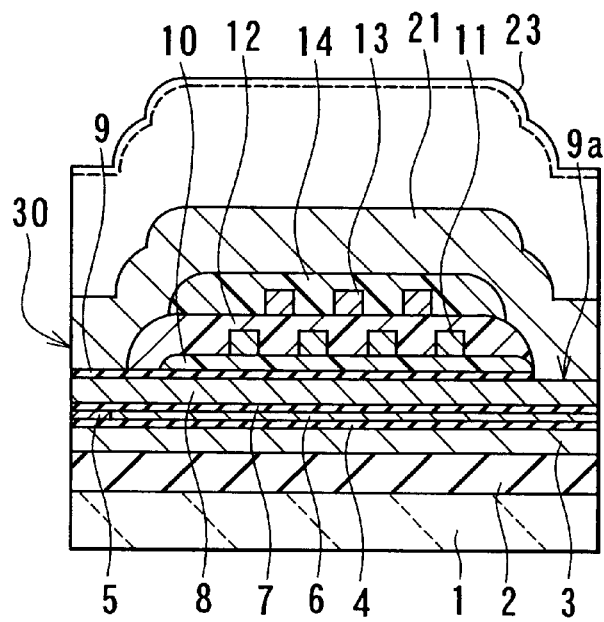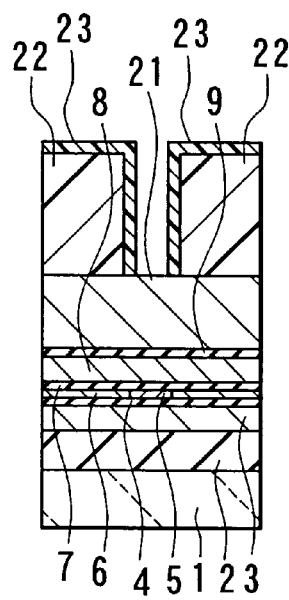
FIG. 18A  FIG. 18B
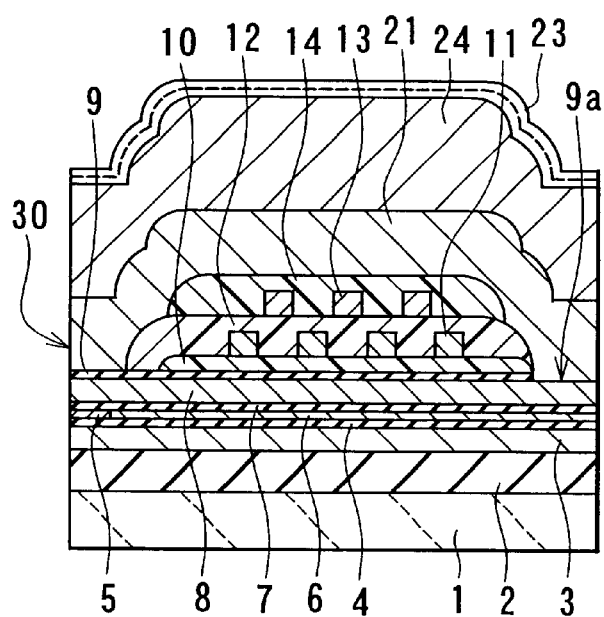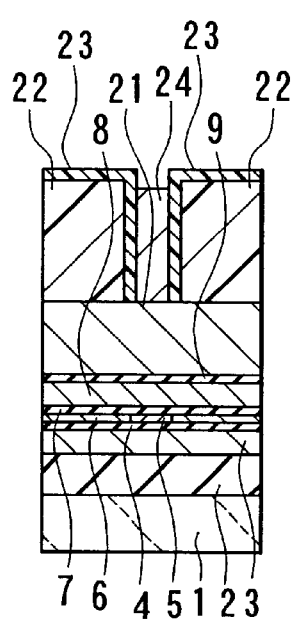
FIG. 19A  FIG. 19B

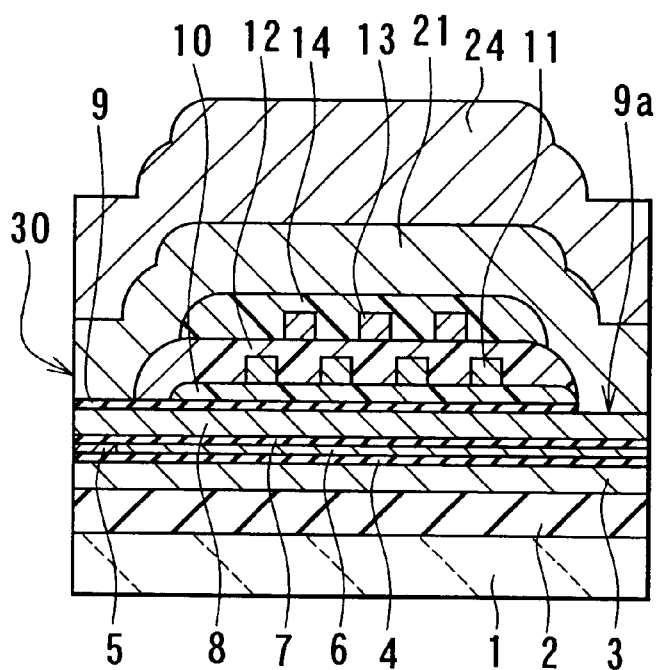
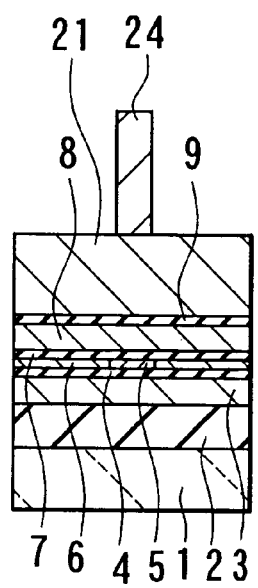
FIG. 20A  FIG. 20B
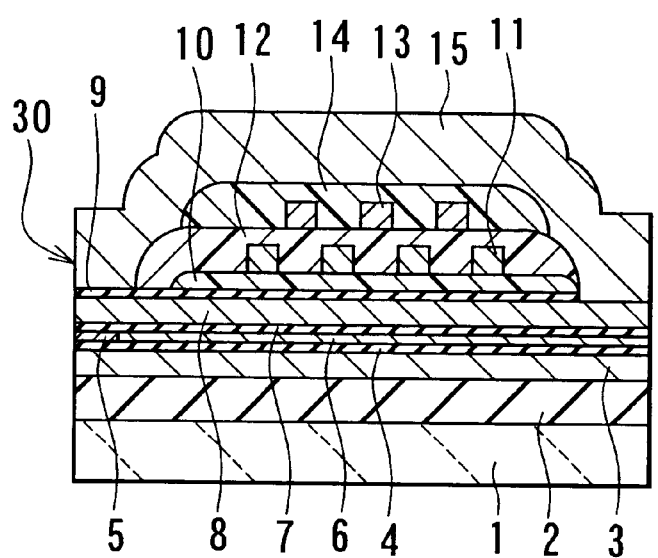
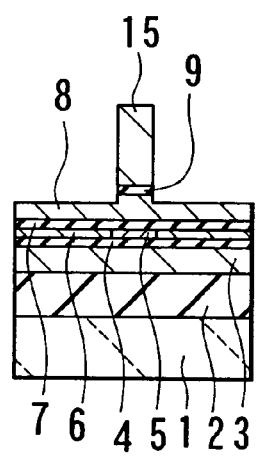
FIG. 21A  FIG. 21B

METHOD OF FRAME PLATING AND METHOD OF FORMING MAGNETIC POLE OF THIN-FILM MAGNETIC HEAD

BACKGROUND OF THE INVENTION

1. Field of the Invention

The present invention relates to a method of frame plating and a method of forming a magnetic pole of a thin-film magnetic head through the use of the method of frame plating.

2. Description of the Related Art

Performance improvements in thin-film magnetic heads have been sought as areal recording density of hard disk drives has increased. Such thin-film magnetic heads include composite thin-film magnetic heads that have been widely used. A composite head is made of a layered structure including a write (recording) head having an induction-type electromagnetic transducer for writing and a read (reproducing) head having a magnetoresistive (MR) element for reading.

It is required to increase the track density on a magnetic recording medium in order to increase recording density among the performance characteristics of a write head. To achieve this, it is required to implement a write head of a narrow track structure wherein the track width, that is, the width of top and bottom magnetic poles sandwiching the write gap layer on a side of the air bearing surface (medium facing surface) is reduced down to microns or the order of submicron. Semiconductor process techniques are utilized to implement such a structure.

For example, frame plating is used as a method for forming the magnetic poles that define the track width. In a conventional method of frame plating, as disclosed in Published Unexamined Japanese Patent Application Sho 50-95147, an electrode film is formed on a base layer, a resist layer is formed on the electrode film, and this resist layer is patterned through a photolithography process to form a frame to be used for plating. Using this frame, plating is performed through the use of the electrode film previously formed as a seed layer. A patterned plating pattern is thereby formed.

According to the conventional method of frame plating, a resist layer is patterned using optical measures and a patterned plating layer is formed using the resulting frame, and therefore it is theoretically impossible to form a plating layer patterned more finely than a dimension determined by an optical limit. Consequently, it has been impossible, by means of frame plating, to form a magnetic pole finer than the dimension determined by an optical limit.

For example, a method of forming a finely patterned resist layer is disclosed in Published Unexamined Japanese Patent Applications Hei 6-250379, Hei 10-73927 and Hei 11-204399 as follows. Specifically, in this method, a first resist containing a material generating an acid is used to form a first patterned resist layer and this first patterned resist layer is coated with a second resist that is water-soluble and capable of entering into a crosslinking reaction in the presence of an acid, to allow the acid to be generated in the first patterned resist layer, thereby forming a crosslinking film in a portion of the second resist near the boundary that touches the first patterned resist layer, followed by peeling off the non-crosslinked portion of the second resist to form a second patterned resist layer. In the present application, this method is hereinafter called a finely patterned resist layer-forming method.

The finely patterned resist layer-forming method described above was developed for a dry step such as dry etching used in usual technologies concerning production of semiconductors as shown in Published Unexamined Japanese Patent Applications Hei 10-73927 and Hei 11-204399.

The inventor of the present invention thought of using the patterned resist layer obtained by the above-mentioned finely patterned resist layer-forming method as a frame for frame plating in order to form a plating layer patterned more finely than the dimension determined by an optical limit.

However, through an experiment the inventor found that no finely patterned plating layer was obtainable by simply using the patterned resist layer formed by the finely patterned resist layer-forming method as the frame for frame plating to form a patterned plating layer.

Here, reference is made to FIG. 23 to FIG. 33 to describe the method used in the experiment for forming the patterned plating layer, and, at the same time, the fact that no finely patterned plating layer is obtainable by this method will be explained.

In this method, as shown in FIG. 23, a base film 152 for plating is first formed using a conductive material as necessary on a layer 151 which will be a base of a plating layer to be formed.

Next, as shown in FIG. 24, a first resist containing a material generating an acid is applied and then prebaked to form a first resist layer 153.

Then, as shown in FIG. 25, the first resist layer 153 is subjected to an exposure step, a baking step in succession to the exposure step, a developing step, a washing step and a drying step in this order to form a first patterned resist layer 153A having an isolated trench. However, the aforementioned drying step may be omitted.

Thereafter, as shown in FIG. 26, a second resist that is water-soluble and capable of entering into a crosslinking reaction in the presence of an acid is applied to cover the first patterned resist layer 153A, thereby forming a second resist layer 154.

Next, as shown in FIG. 27, heat treatment for the first patterned resist layer 153A and the second resist layer 154 is carried out to generate an acid in the first patterned resist layer 153A and to diffuse the acid to the second resist layer 154. A crosslinked film 154A is thereby formed in a portion of the second resist layer 154 near the boundary that touches the first patterned resist layer 153A.

Here, the crosslinked film 154A grows only from the surface of the first patterned resist layer 153A and therefore the adhesion of the crosslinked film 154A to the base film 152 is weakened. Also, if the heat resistance of the first patterned resist layer 153A is low (low glass transition temperature), the first patterned resist layer 153A is strained when the first patterned resist layer 153A and the second resist layer 154 are heat-treated. As a result, the crosslinked film 154A having weak adhesion to the base film 152 is peeled off from the base film 152, leading to the occurrence of a clearance between the crosslinked film 154A and the base film 152.

Next, as shown in FIG. 28, in succession to washing with an aqueous isopropanol solution, a washing step and a drying step are carried out in this order to peel off the non-crosslinked portion of the second resist layer 154 thereby forming a second patterned resist layer 154B consisting of the crosslinked film 154A. In this manner, a frame having a narrowed trench is formed by the first patterned resist layer 153A and the second patterned resist layer 154B.

At this time, there is a clearance between the second patterned resist layer 154B and the base film 152.

Next, as shown in FIG. 29, plating is carried out using the base film 152 as a seed layer by using a frame consisting of the first patterned resist layer 153A and the second patterned resist layer 154B to form plating layers 155A and 155B. Here, the symbol 155A represents an object patterned plating layer formed in the trench, and the symbol 155B represents a plating layer formed in other portions.

When the above plating layer is formed, a plating solution enters the clearance between the second patterned resist layer 154B and the base film 152, which causes the clearance to be plated, too. Also, the plating layer grows while it intends to spread and therefore the clearance is forcedly extended. As a result, the width of the bottom of the patterned plating layer 155A becomes greater than a desired width by the width of the second patterned resist layer 154B.

Next, as shown in FIG. 30, the frame is removed using an organic solvent. Then, as shown in FIG. 31, the base film 152 at the portion where the frame existed is removed by dry etching such as ion milling and reactive ion etching, or by wet etching.

Next, as shown in FIG. 32, a patterned resist layer 156 is formed to cover the object patterned plating layer 155A.

Then, as shown in FIG. 33, the plating layer 155B and the base film 152 disposed underneath that are no longer necessary are removed by wet etching. Thereafter, the patterned resist layer 156 is removed using an organic solvent to obtain an object patterned plating layer 155C comprising the plating layer 155A. The patterned plating layer 155C thus obtained has a shape in which the bottom is wider.

As described above, when the patterned resist layer formed by the finely patterned resist layer-forming method of the related art is used, the crosslinked film 154A is peeled off from the base film 152 because of weak adhesion between the crosslinked film 154A and the base film 152 and the strain of the first patterned resist layer 153A caused by heat treatment. As a result, a clearance is formed between the second patterned resist layer 154B and the base film 152. Then, when a patterned plating layer is formed using this patterned resist layer as a frame, the clearance is plated resultantly plated, too. Therefore, when a patterned plating layer is formed using the patterned resist layer formed simply by the finely patterned resist layer-forming method, there is the problem that a finely patterned plating layer cannot be obtained. This problem becomes more significant as the thickness of the resist layer to be the frame is increased.

As shown in Published Unexamined Japanese Patent Applications Hei 10-73927 and Hei 11-204399, when a patterned resist layer formed by the finely patterned resist layer-forming method is used as a mask to perform dry etching such as reactive ion etching in usual semiconductor manufacturing technologies, slight peeling of the crosslinked film 154A from the base film 152 poses no problem. The above-mentioned problem was therefore unpredictable.

OBJECT AND SUMMARY OF THE INVENTION

It is an object of the present invention to provide a method of frame plating which enables to form a plating layer patterned more finely than the dimension determined by an optical limit, and a method of forming a magnetic pole of a thin-film magnetic head which enables to form a magnetic pole finer than the dimension determined by an optical limit, using the above-mentioned method of frame plating.

A method of frame plating according to the invention comprises:
a step of forming a frame using a resist and a step of performing plating by using the frame to form a patterned plating layer;
the step of forming the frame including:
a step of forming a first patterned resist layer by using a first resist containing a material generating an acid; and
a step of forming a second patterned resist layer by coating the first patterned resist layer with a second resist capable of entering into a crosslinking reaction in the presence of an acid, generating an acid in the first patterned resist layer, forming a crosslinked film in a portion of the second resist near the boundary that touches the first patterned resist layer, and peeling off non-crosslinked portions of the second resist, wherein the frame is formed using the first patterned resist layer and the second patterned resist layer; and
the first resist comprises the following compounds (A) to (D):
(A) an organic solvent;
(B) a base resin comprising a high molecular compound shown in the following formula (1), the compound having a weight average molecular weight of 10000 to 25000 and a molecular weight distribution as narrow as 1.05 to 1.25;
(C) an acid generating agent; and
(D) an aromatic compound having a group given by the formula ≡C —COOH in its molecule:

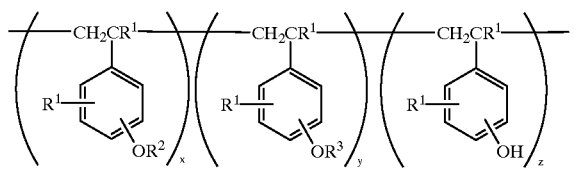

(1)

In the above formula (1), $R^1$ represents a hydrogen atom or a methyl group, $R^2$ represents a group represented by the following formula (2), $R^3$ represents an acid-unstabilizing group different from $R^2$:

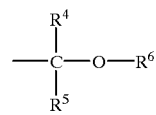

(2)

In the above formula (2), $R^4$ and $R^5$ each independently represent a hydrogen atom or a straight chain or branched alkyl group having 1 to 6 carbon atoms, $R^6$ represents a straight chain, branched or cyclic alkyl group having 1 to 10 carbon atoms, or $R^4$ and $R^5$, $R^4$ and $R^6$ or $R^5$ and $R^6$ may form a ring. In the case of forming a ring, $R^4$, $R^5$ and $R^6$ each independently represent a straight chain or branched alkylene group having 1 to 6 carbon atoms. Each of x and y denotes 0 or a positive number, provided that x and y are not 0 at the same time. z denotes a positive number wherein the following relationships are established between x, y and z: $0 \leq x/(x+y+z) \leq 0.5$, $0 \leq y/(x+y+z) \leq 0.5$ and $0.4 \leq z/(x+y+z) \leq 0.9$.

In the method of frame plating according to the invention, $R^3$ in the formula (1) may be $-CO_2C(CH_3)_3$.

According to the method of frame plating of the invention, it is possible to form a fine frame free from disorders during plating in the step of forming the frame, and it is therefore possible to form a fine patterned plating layer using this frame.

A first method of forming a magnetic pole of a thin-film magnetic head according to the invention is provided forming a layer including a magnetic pole portion of a thin-film magnetic head that comprises: a medium facing surface that faces toward a recording medium; a first magnetic layer and a second magnetic layer magnetically coupled to each other and including magnetic pole portions opposed to each other and placed in regions of the magnetic layers on a side of the medium facing surface, each of the magnetic layers including at least one layer; a gap layer provided between the magnetic pole portions of the first and second magnetic layers; and a thin-film coil at least a part of which is placed between the first and second magnetic layers, the at least part of the coil being insulated from the first and second magnetic layers. The layer including the magnetic pole portion is formed using the method of frame plating according to the invention.

The first method of forming a magnetic pole of a thin-film magnetic head of the invention makes it possible to form a fine magnetic pole using the method of frame plating of the invention.

A second method of forming a magnetic pole of a thin-film magnetic head according to the invention is provided for forming a layer including a magnetic pole portion of a thin-film magnetic head that comprises: a medium facing surface that faces toward a recording medium; a first magnetic layer and a second magnetic layer magnetically coupled to each other and including magnetic pole portions opposed to each other and placed in regions of the magnetic layers on a side of the medium facing surface, each of the magnetic layers including at least one layer; a gap layer provided between the magnetic pole portions of the first and second magnetic layers; and a thin-film coil at least a part of which is placed between the first and second magnetic layers, the at least part of the coil being insulated from the first and second magnetic layers, the method including the steps of: forming a layer to be patterned, the layer being to be the layer including the magnetic pole portion; forming a mask for etching on the layer to be patterned by the use of the method of frame plating of the invention; and forming the layer including the magnetic pole portion by patterning the layer to be patterned, through etching the layer by dry etching using the mask.

The second method of forming a magnetic pole of a thin-film magnetic head of the invention makes it possible to form a mask for fine etching by using the method of frame plating of the invention, and therefore makes it possible to form a fine magnetic pole by etching the layer to be patterned by using the mask.

Other objects, characteristics and advantages of the invention will appear more fully from the following description.

BRIEF DESCRIPTION OF THE DRAWINGS

FIG. 12A and FIG. 12B are cross sections for illustrating a step in an example of a method of manufacturing a composite thin-film magnetic head by using a method of forming a magnetic pole of a second embodiment of the invention.

FIG. 13A and FIG. 13B are cross sections for illustrating a step that follows FIG. 12A and FIG. 12B.

FIG. 14A and FIG. 14B are cross sections for illustrating a step that follows FIG. 13A and FIG. 13B.

FIG. 15A and FIG. 15B are cross sections for illustrating a step that follows FIG. 14A and FIG. 14B.

FIG. 16A and FIG. 16B are cross sections for illustrating a step in an example of a method of manufacturing a composite thin-film magnetic head by using a method of forming a magnetic pole of a third embodiment of the invention.

FIG. 17A and FIG. 17B are cross sections for illustrating a step that follows FIG. 16A and FIG. 16B.

FIG. 18A and FIG. 18B are cross sections for illustrating a step that follows FIG. 17A and FIG. 17B.

FIG. 19A and FIG. 19B are cross sections for illustrating a step that follows FIG. 18A and FIG. 18B.

FIG. 20A and FIG. 20B are cross sections for illustrating a step that follows FIG. 19A and FIG. 19B.

FIG. 21A and FIG. 21B are cross sections for illustrating a step that follows FIG. 20A and FIG. 20B.

DETAILED DESCRIPTION OF THE PREFERRED EMBODIMENTS

Embodiments of the invention will be hereinafter described in detail with reference to the drawings.

[First Embodiment]

Firstly, a method of frame plating of a first embodiment of the invention will be explained with reference to FIG. 1 to FIG. 11.

Figure 1:
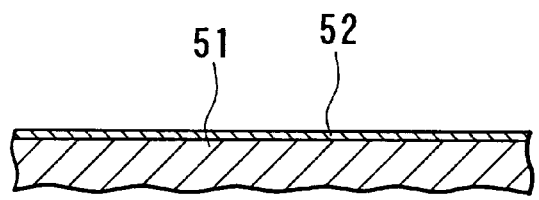
FIG. 1 is a cross section for illustrating a step in a frame plating method of a first embodiment of the invention.

In the method of frame plating of the embodiment, as shown in FIG. 1, a base film 52 for plating is first formed, using a conductive material as necessary, on a layer 51 that is to be a base of a plating layer intended to be formed.

Figure 2:
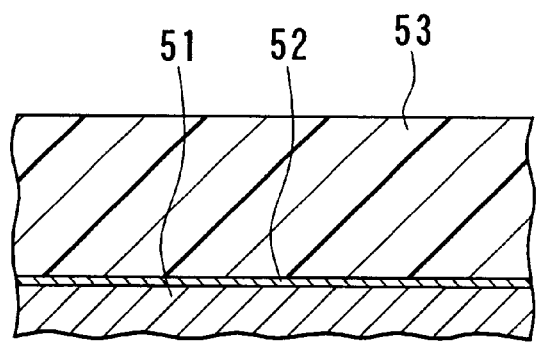
FIG. 2 is a cross section for illustrating a step that follows FIG. 1.

Next, as shown in FIG. 2, a first resist containing a material generating an acid is applied and then prebaked to form a first resist layer 53. The resist material used for the first resist in this embodiment will be described later in detail.

Figure 3:
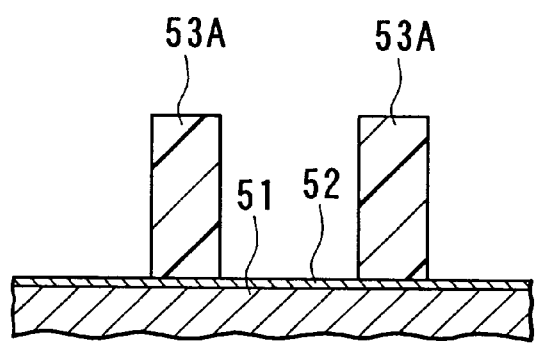
FIG. 3 is a cross section for illustrating a step that follows FIG. 2.

Then, as shown in FIG. 3, the first resist layer 53 is exposed to light through a predetermined mask, and then each of steps of baking after exposure, developing, washing and drying is carried out in order, so as to form a first patterned resist layer 53A having an isolated trench. However, the above drying step may be omitted.

Figure 4:
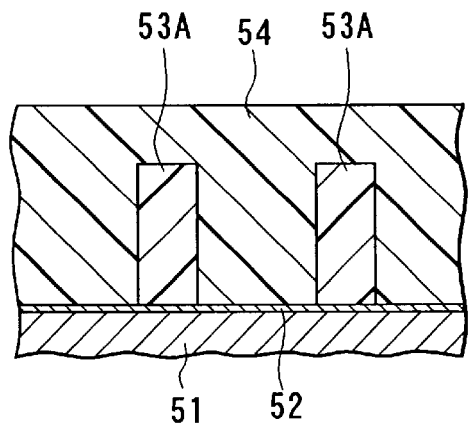
FIG. 4 is a cross section for illustrating a step that follows FIG. 3.

Next, as shown in FIG. 4, a second resist that is water-soluble and capable of entering into a crosslinking reaction in the presence of an acid is applied to coat the first patterned resist layer 53A, thereby forming a second resist layer 54.

Figure 5:
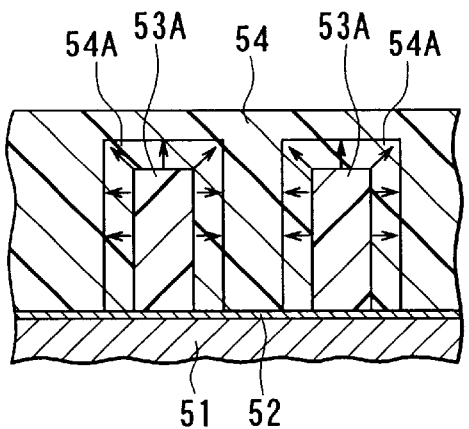
FIG. 5 is a cross section for illustrating a step that follows FIG. 4.

Next, as shown in FIG. 5, the first patterned resist layer 53A and the second resist layer 54 are heat-treated to generate an acid in the first patterned resist layer 53A and to diffuse the acid into the second resist layer 54. A crosslinking film 54A is thus formed in a portion of the second resist layer 54 near the boundary that touches the first patterned resist layer 53A.

Figure 6:
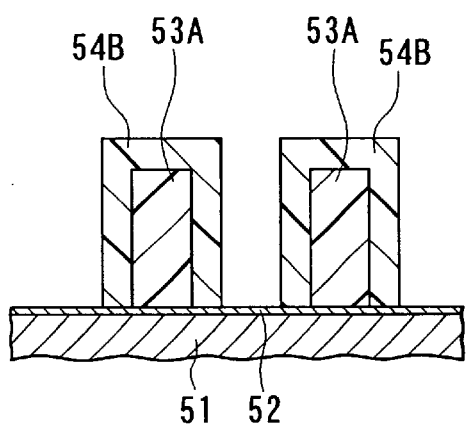
FIG. 6 is a cross section for illustrating a step that follows FIG. 5.

Then, as shown in FIG. 6, washing is carried out using, for example, an aqueous isopropanol solution, followed by a step of washing with water and a drying step in this order to peel off the non-crosslinked portion of the second resist layer 54, thereby forming a second patterned resist layer 54B consisting of the crosslinked film 54A. Thus, a frame having a narrowed trench is formed by the first patterned resist layer 53A and the second patterned resist layer 54B.

Figure 7:
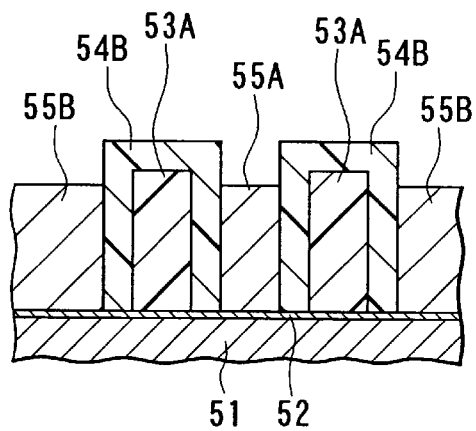
FIG. 7 is a cross section for illustrating a step that follows FIG. 6.

Next, as shown in FIG. 7, using the frame consisting of the first patterned resist layer 53A and the second patterned resist layer 54B, plating is carried out using the base film 52 as a seed layer to form plating layers 55A and 55B. Here, the symbol 55A represents an object patterned plating layer formed in the trench, and the symbol 55B represents a plating layer formed in other portions.

Figure 8:
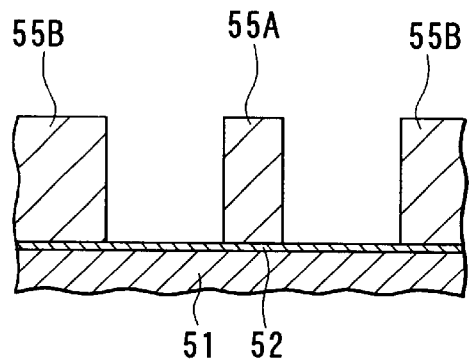
FIG. 8 is a cross section for illustrating a step that follows FIG. 7.
Figure 9:
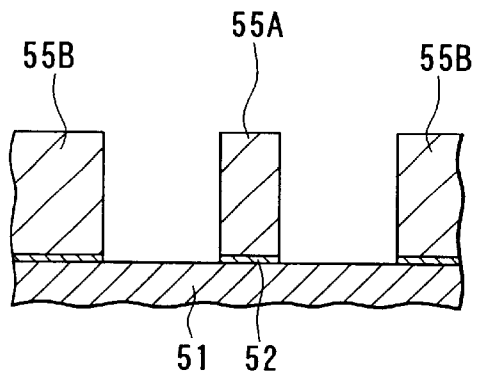
FIG. 9 is a cross section for illustrating a step that follows FIG. 8.

Then, as shown in FIG. 8, the frame is removed using an organic solvent. Then, as shown in FIG. 9, the base film 52 at the portion where the frame existed is removed by dry etching such as ion milling and reactive ion etching, or by wet etching.

Figure 10:
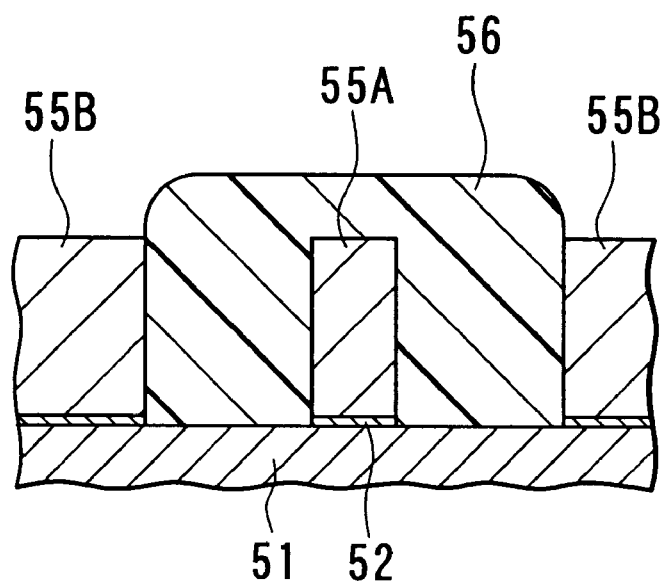
FIG. 10 is a cross section for illustrating a step that follows FIG. 9.

Next, as shown in FIG. 10, a patterned resist layer 56 is formed to coat the object patterned plating layer 55A.

Figure 11:
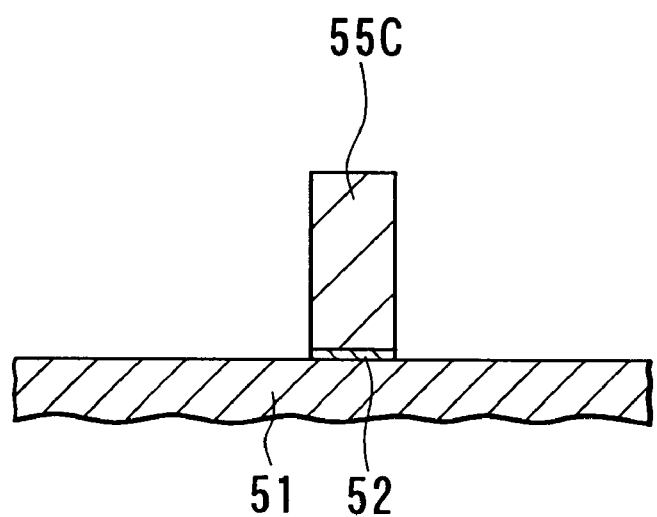
FIG. 11 is a cross section for illustrating a step that follows FIG. 10.

Then, as shown in FIG. 11, the plating layer 55B and the base film 52 disposed underneath which become unnecessary are removed by wet etching. Thereafter, the patterned resist layer 56 is removed using an organic solvent to obtain an object patterned plating layer 55C comprising the plating layer 55A.

Next, the resist material to be used for the first resist in this embodiment will be described in detail. A chemically amplifying type positive resist material containing the following (A) to (D) is used for the first resist in this embodiment:

(A) an organic solvent;
(B) a base resin comprising a high molecular compound shown in the following formula (1), the compound having a weight average molecular weight of 10000 to 25000 and a molecular weight distribution as narrow as 1.05 to 1.25;
(C) an acid generating agent; and
(D) an aromatic compound having a group given by the formula ≡C—COOH in its molecule:

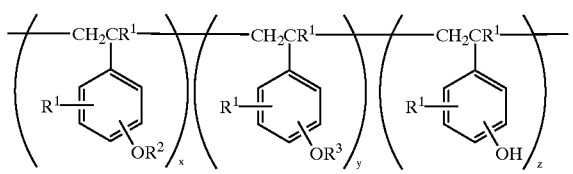

(1)

In the above formula (1), $R^1$ represents a hydrogen atom or a methyl group, $R^2$ represents a group represented by the following formula (2), $R^3$ represents an acid-unstabilizing group different from $R^2$:

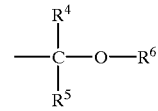

(2)

In the above formula (2), $R^4$ and $R^5$ each independently represent a hydrogen atom or a straight chain or branched alkyl group having 1 to 6 carbon atoms, $R^6$ represents a straight chain, branched or cyclic alkyl group having 1 to 10 carbon atoms, or $R^4$ and $R^5$, $R^4$ and $R^6$ or $R^5$ and $R^6$ may form a ring. In the case of forming a ring, $R^4$, $R^5$ and $R^6$ each independently represent a straight chain or branched alkylene group having 1 to 6 carbon atoms. Each of x and y denotes 0 or a positive number, provided that x and y are not 0 at the same time. z denotes a positive number wherein the following relationships are established between x, y and z: $0 \leq x/(x+y+z) \leq 0.5$, $0 \leq y/(x+y+z) \leq 0.5$ and $0.4 \leq z/(x+y+z) \leq 0.9$.

$R^3$ in the formula (1) may be $—CO_2C(CH_3)_3$.

Specific examples which may be used as the components (A) to (D) of the chemically amplifying positive type resist material include those shown in Published Unexamined Japanese Patent Application Hei 10-20504. However, for use in the present embodiment it is required that the high molecular compound which is the component (B) has a weight average molecular weight of 10000 to 25000 and a molecular weight distribution as narrow as 1.05 to 1.25. The molecular weight distribution is given by the formula: weight average molecular weight ($M_w$)/number average molecular weight ($M_n$).

According to the present embodiment, the aforementioned chemically amplifying type positive resist material is used for the first resist, and therefore it possible to form a plating layer patterned more finely than the dimension determined by an optical limit, without occurrence of disorders which arise in the case of forming a patterned resist layer by using, as a frame, a patterned resist layer formed simply by the conventional finely patterned resist layer-forming method. This reason will be explained below.

Through an experiment made by the inventor, it was found that the base resin that is the component (B) of the aforementioned chemically amplifying type positive resist material used for the first resist had a high heat resistance (glass transition temperature) and therefore strain of the first patterned resist 53A during the heat-treatment shown in FIG. 5 was decreased. As a result, this embodiment prevents the crosslinked film 54A from being easily peeled off from the base film 52, and therefore prevents occurrence of a clearance between the crosslinked film 54A and the base film 52. Consequently, this embodiment prevents a plating solution from entering the clearance between the second patterned resist layer 54B and the base film 52 during plating, and thereby prevents the bottom of the patterned plating layer 55C from becoming wider. It is therefore possible to form a patterned plating layer finer than the dimension determined by an optical limit by making effective use of the finely patterned resist layer-forming method.

Next, description will now be made as to the significance of the requirements given to the component (B) of the resist material concerning the weight average molecular weight and the molecular weight distribution.

Various combinations are possible for a modification group of the base resin shown in the formula (1). However, the experiment made by the inventor showed that a difference in the combination of the modification group had almost no influence on the heat resistance (glass transition temperature) of the base resin. Primarily the weight average molecular weight and the molecular weight distribution of the base resin influenced the heat resistance of the base resin.

Then, for an experiment the inventor prepared resists described below that are different only in the weight average molecular weight and the molecular weight distribution of the base resin, to form a first patterned resist layer using each of the resists. Each resulting first patterned resist layer was subjected to treatment for narrowing the trench by using the finely patterned resist layer-forming method under conditions described below. A frame for frame plating was thereby formed and plating was carried out using the frame. Thus, the inventor studied whether or not a finely patterned plating layer was obtained.

In the experiment, chemically amplifying type positive resist materials containing the following components (A), (B'), (C) and (D) were used for the resists for forming the first patterned resist layer.

As the component (A), an organic solvent containing propylene glycol monomethyl ether acetate and ethyl lactate (45% by weight:20% by weight) was used in a proportion of 65% by weight.

As the base resin which was the component (B'), a high molecular compound represented by the formula (1) wherein $R^1$ was a hydrogen atom; each of $R^4$, $R^5$ and $R^6$ in $R^2$ represented by the formula (2) was —$CH_3$; and $R^3$ was —$CO_2C(CH_3)_3$ was used in a proportion of 32% by weight.

As the acid generating agent which was the component (C), triphenylsulfonium p-toluenesulfonate was used in a proportion of 2% by weight.

As the aromatic compound which was the component (D), 1-Np—O—$CH_2$—COOH (Np: naphthalene ring) was used in a proportion of about 1% by weight.

Also, as other components in the above chemically amplifying type positive resist materials, a surfactant Fluorad (FC-430) (trade name) was used in a proportion of about 0.01% by weight.

The weight average molecular weight and the molecular weight distribution of the base resin were respectively adjusted such that each independently fell in a value to be intended by the following method. Even the same types of polymer differ in solubility or distribution ratio in the same solvent depending on the molecular weight. Generally, the larger the molecular weight is, the lower the solubility is. Making use of this phenomenon, polymers having various molecular weights and a small molecular weight distribution can be obtained. Specifically, polymers are first purified from a material containing polymers having various molecular weights and impurities, the material having been obtained by a method such as radical polymerization, cationic polymerization and anionic polymerization. Such purification of polymers is attained by using, for example, methanol and solubilizing the polymers alone in methanol to precipitate the unreacted products and impurities. Next, the material containing the polymers having various molecular weights thus obtained, in other words, a polymer having a large molecular weight distribution, is re-dissolved in methanol, and a solvent such as benzene or water, which lowers the solubility of the polymer is gradually added to the solution. Then, the polymers are precipitated in order of molecular weight. The precipitated polymers are industriously sampled to thereby obtain polymers having various molecular weights and a small molecular weight distribution. Further, these polymers are re-mixed in a predetermined ratio, whereby polymers having a desired molecular weight and a desired molecular weight distribution can be obtained. The aforementioned method is also described in Published Unexamined Japanese Patent Applications Hei 6-273934 and Hei 6-273935.

Also, in the experiment, the following water-soluble resin mixture was used as the second resist. This water-soluble resin mixture was a mixed solution of a water-soluble resin and a water-soluble crosslinking agent. The mixed solution was obtained by mixing 20 g of purified water with 160 g of an aqueous solution containing 5% by weight of polyvinylacetal and 20 g of an aqueous solution of about 10% by weight of (N-methoxymethyl)methoxyethyleneurea under stirring at room temperature for 6 hours. The aqueous solution containing 5% by weight of polyvinylacetal was obtained by adding 400 g of purified water to 100 g of an aqueous solution containing 20% by weight of a polyvinylacetal resin S-lec KW3 (trade name) manufactured by Sekisui Chemical Co., Ltd. in a 1 L measuring flask and stirring the mixture at room temperature for 6 hours. Also, the aqueous solution of (N-methoxymethyl) methoxyethyleneurea was obtained by adding 860 g of purified water and 40 g of IPA (isopropanol) to 100 g of (N-methoxymethyl)methoxyethyleneurea in a 1 L measuring flask and stirring the mixture at room temperature for 6 hours.

Next, a method of forming the first patterned resist layer in the experiment will be explained. In the experiment, the first patterned resist layer was formed by the following procedures (a) to (c).

(a) First, a film of NiFe was formed in a thickness of 0.1 μm by sputtering on a surface of a silicon substrate to form a base film. Then, the aforementioned chemically amplifying type positive resist material was applied to the base film by spin coating such that the thickness after pre-baking was 5 μm, and pre-baking was performed using a hot plate at 120° C. for 240 seconds.

(b) Next, the resist was exposed to light by using an excimer laser stepper (Nikon NSR-2205EX12B, exposure wavelength: 248 nm and NA: 0.4) and a mask having a mask space (the width of the transparent portion of a mask) of 0.4 μm at an exposure intensity of about 200 mJ/cm². The exposure wavelength to be used is not limited to 248 nm insofar as it is in an absorption range of the acid generating agent contained in the resist. Thereafter, baking in succession to exposure was performed at 100° C. for 120 seconds by using a hot plate.

(c) Then, using an aqueous solution containing 2.38% of tetramethylammonium hydroxide and having a temperature of 23° C., the resist was developed using puddle development for 50 seconds and this developing operation was repeated five times, followed by washing with water and drying.

By the above procedures (a) to (c), a first patterned resist layer having a thickness of 5 μm and an isolated trench having a trench interval of 0.4 μm was obtained. In a resist layer having a thickness of about 5 μm, a minimum trench interval which can be optically formed is theoretically about 0.4 μm.

Next, description will be given as to treatment for narrowing the trench in the experiment. In the experiment, the treatment for narrowing the trench according to the finely patterned resist layer-forming method was carried out by the following procedures (d) to (f).

(d) First, to the silicon substrate on which the base film and the first patterned resist layer were formed by the procedures (a) to (c), the aforementioned second resist was applied by spin coating so as to coat the first patterned resist layer, thereby forming a second resist layer. Then, baking was performed using a hot plate at 85° C. for 70 seconds. The first patterned resist layer and the second resist layer were then heat-treated using a hot plate at 100° C. for 90 seconds.

(e) Next, the substrate was washed with an aqueous solution of 10% by weight of isopropanol and then with water.

(f) Next, the substrate was post-baked using a hot plate at 90° C. for 90 seconds.

By the above procedures (d) to (f), a second patterned resist layer having a thickness of 5 μm and an isolated trench having a trench interval of 0.3 μm was obtained. A frame for frame plating is formed by the first patterned resist layer and the second patterned resist layer.

Next, a method of forming a patterned plating layer in the experiment will be described. In the experiment, a patterned plating layer was formed through frame plating by the following procedures (g) to (i).

(g) First, as pretreatment for plating, the silicon substrate on which the base film and the above frame were formed was washed with a 5% aqueous solution of HCl and then with water.

(h) Next, using a NiFe plating bath containing a plating solution having the components and composition shown in the table below, NiFe was formed in a thickness of about 4 μm by frame plating through the use of the above frame, followed by washing with water and drying. The plating was carried out in the following conditions: bath temperature: 40° C., current density: $3.5 \times 10^{-3}$ A/cm² and anode: NiFe.

TABLE 1

| Component | Composition |
| --- | --- |
| Nickel sulfate $NiSO_4 \cdot 6H_2O$ | 350 g/liter |
| Ferrous sulfate $FeSO_4 \cdot 7H_2O$ | 10 g/liter |
| Boric acid $H_3BO_3$ | 30 g/liter |

TABLE 1-continued

| Component | Composition |
| --- | --- |
| Ammonium chloride $NH_4Cl$ | 20 g/liter |
| Sodium saccharide $C_7H_4NNaO_3S \cdot 2H_2O$ | 1 g/liter |
| Sodium laurylsulfate $CH_3(CH_2)_{11}OSO_3Na$ | 0.05 g/liter |

(i) Next, the frame was dissolved in acetone and removed, followed by drying to obtain a plating layer patterned with an isolated line of NiFe and having a width of about 0.3 μm and a height of about 4 μm.

Then, in the experiment, the resulting patterned plating layer was observed using a length measuring SEM (scan type electron microscope) (HITACHI S-7000) to check whether or not some disorders of the patterned plating layer were caused by the plating solution entering the clearance between the second patterned resist layer and the base film.

It was found from the above experiment that it was required for the base resin to have a weight average molecular weight ranging from 10000 to 25000. Specifically, when the weight average molecular weight was less than 10000, the heat resistance of the resist material was inferior, giving rise to disorders caused by the occurrence of a clearance between the second patterned resist layer and the base film. When the weight average molecular weight exceeded 25000, the alkali-solubility was lowered, leading to impaired resolution, with the result that a patterned resist layer having a trench interval of 0.6 μm or less could not be formed.

On the other hand, while it is ideal that the base resin has a molecular weight distribution of 1.0, a resin having a molecular weight distribution of less than 1.05 could not be synthesized, and, when the molecular weight distribution exceeded 1.25, the glass transition temperature was below 160° C. even if the weight average molecular weight was 25000, and therefore the heat resistance of the resist material was inferior, giving rise to disorders caused by the occurrence of a clearance between the second patterned resist layer and the base film.

As described above, according to the method of frame plating of this embodiment, it is possible to form a plating layer patterned more finely than the dimension determined by an optical limit, without occurrence of disorders that may be caused by application of the finely patterned resist layer-forming method.

[Second Embodiment]

Next, a method of forming a magnetic pole of a thin-film magnetic head according to a second embodiment of the invention will now be described. The method according to this embodiment is a method of forming a magnetic pole of a thin-film magnetic head by using the method of frame plating according to the first embodiment.

Reference is now made to FIG. 12A to FIG. 15A and FIG. 12B to FIG. 15B to describe an example of a method of manufacturing a composite thin-film magnetic head by using the method of forming a magnetic pole according to this embodiment. FIG. 12A to FIG. 15A are cross sections each orthogonal to an air bearing surface, and FIG. 12B to FIG. 15B are cross sections each parallel to the air bearing face.

In the method of manufacturing the thin-film magnetic head of this example, as shown in FIG. 12A and FIG. 12B, an insulating layer 2 made of an insulating material such as alumina ($Al_2O_3$) or silicon dioxide ($SiO_2$) whose thickness is 1 to 20 μm, for example, is deposited through a method such as sputtering on a substrate 1 made of a ceramic material such as aluminum oxide and titanium carbide ($Al_2O_3$—TiC). On the insulating layer 2 a bottom shield layer 3 made of a magnetic material and having a thickness of 0.1 to 5 μm, for example, is formed for making a read head. The bottom shield layer 3 may be made of a magnetic material such as FeAlSi, NiFe, CoFe, CoFeNi, FeN, FeZrN, FeTaN, CoZrNb, or CoZrTa. The bottom shield layer 3 may be formed through sputtering or plating.

Next, a bottom shield gap film 4 having a thickness of 10 to 200 nm, for example, and made of an insulating material such as $Al_2O_3$ or $SiO_2$ is formed through a method such as sputtering on the bottom shield layer 3. On the bottom shield gap film 4, an MR element 5 for reproduction having a thickness of tens of nanometers, for example, is formed through a method such as sputtering. The MR element 5 may be an element made of a magnetosensitive film exhibiting a magnetoresistivity, such as an AMR element, a GMR element, or a tunnel magnetoresistive (TMR) element. Next, on the bottom shield gap film 4, a pair of electrode layers 6 having a thickness of tens of nanometers are formed through a method such as sputtering. The electrode layers 6 are electrically connected to the MR element 5. Next, a top shield gap film 7 having a thickness of 10 to 200 nm, for example, and made of an insulating material such as $Al_2O_3$ or $SiO_2$ is formed through a method such as sputtering on the bottom shield gap film 4 and the MR element 5.

The layers making up the above-described read head are patterned through an ordinary etching method using a resist pattern or liftoff, or the combination of such etching and liftoff.

Next, on the top shield gap film 7, a top-shield-layer-cum-bottom-magnetic-pole-layer (called a bottom magnetic pole layer in the following description) 8 is formed. The bottom magnetic pole layer 8 has a thickness of 0.5 to 4.0 μm, for example, and is made of a magnetic material and used for both read head and write head. The bottom magnetic pole layer 8 is made of a soft magnetic material such as NiFe, CoFe, CoFeNi or FeN, and formed through a method such as sputtering or plating.

Next, a write gap layer 9 made of an insulating material such as $Al_2O_3$ or $SiO_2$ whose thickness is 10 to 500 nm, for example, is formed through sputtering, for example, on the bottom magnetic pole layer 8. Next, a portion of the write gap layer 9 located in the center portion of a thin-film coil described later is etched to form a contact hole 9a for making the magnetic path.

Next, an insulating layer 10 of a thermoset photoresist, for example, is formed in a region on the gap layer 9 where the thin-film coil is to be formed. A first layer 11 of the thin-film coil made of a conductive material such as Cu is formed on the insulating layer 10 through a method such as frame plating. Next, an insulating layer 12 of a thermoset photoresist, for example, is formed to cover the insulating layer 10 and the first layer 11 of the coil. A second layer 13 of the thin-film coil made of a conductive material such as Cu is formed on the insulating layer 12 through a method such as frame plating. Next, an insulating layer 14 of a thermoset photoresist, for example, is formed to cover the insulating layer 12 and the second layer 13 of the coil. The first layer 11 and the second layer 13 of the coil are connected to each other and wound around the contact hole 9a. The total thickness of the coil including the first layer 11 and the second layer 13 is 2 to 5 μm, for example. The total thickness of the insulating layers 10, 12 and 14 is 3 to 20 μm, for example.

Next, as shown in FIG. 13A and FIG. 13B, a top magnetic pole layer 15 having a thickness of 3 to 5 μm, for example, is formed for the write head in a region extending from the air bearing surface (medium facing surface) 30 through a portion on top of the insulating layers 12 and 14 to the contact hole 9a. The top magnetic pole layer 15 is made of a soft magnetic material such as NiFe, CoFe, CoFeNi or FeN. The top magnetic pole layer 15 is formed through the method of frame plating according to the first embodiment of the invention.

The magnetic pole portions of the bottom magnetic pole layer 8 and the top magnetic pole layer 15 are the portions located on a side of the air bearing surface 30 and opposed to each other, the write gap layer 9 being placed between the magnetic pole portions. In this example, the magnetic pole portion of the top magnetic pole layer 15 has a width equal to the write track width and defines the write track width. The bottom magnetic pole layer 8 and the top magnetic pole layer 15 are magnetically coupled to each other through the contact hole 9a.

Next, as shown in FIG. 14A and FIG. 14B, the write gap layer 9 is selectively etched through dry etching, using the magnetic pole portion of the top magnetic pole layer 15 as a mask. This dry etching may be reactive ion etching (RIE) using a chlorine-base gas such as $BCl_2$ or $Cl_2$, or a fluorine-base gas such as $CF_4$ or $SF_6$, for example. Next, the bottom magnetic pole layer 8 is selectively etched by about 0.3 to 0.6 μm, for example, through argon ion milling, for example, thereby forming a trim structure as shown in FIG. 14B. The trim structure suppresses an increase in the effective track width due to expansion of a magnetic flux generated during writing in a narrow track.

Next, as shown in FIG. 15A and FIG. 15B, a protection layer 16 made of an insulating material such as $Al_2O_3$ or $SiO_2$ and having a thickness of 5 to 50 μm, for example, is formed over the entire surface through a method such as sputtering. The surface of the protection layer 16 is then flattened and pads for electrodes that are not shown are formed on the protection layer 16. Finally, lapping of the slider including the foregoing layers is performed to form the air bearing surface 30 of the thin-film magnetic head including the write head and the read head, thereby completing the thin-film magnetic head of this example.

The thin-film magnetic head of this example fabricated as thus described comprises the medium facing surface (air bearing surface 30) that faces toward a recording medium, the read head and the write head. The read head has the MR element 5, and the bottom shield layer 3 and the top shield layer (bottom magnetic pole layer 8) for shielding the MR element 5. Portions of the bottom shield layer 3 and the top shield layer on a side of the air bearing surface 30 are opposed to each other, the MR element 5 being placed between these portions.

The write head has the bottom magnetic pole layer 8 and the top magnetic pole layer 15 magnetically coupled to each other, each of which includes at least one layer. The bottom magnetic pole layer 8 and the top magnetic pole layer 15 include the magnetic pole portions opposed to each other and placed in regions on a side of the air bearing surface 30. The write head further has the write gap layer 9 placed between the magnetic pole portion of the bottom magnetic pole layer 8 and the magnetic pole portion of the top magnetic pole layer 15, and the thin-film coil, including the first layer 11 and the second layer 13, at least a part of which is placed between the bottom magnetic pole layer 8 and the top magnetic pole layer 15, the at least part of the thin-film coil being insulated from the bottom magnetic pole layer 8 and the top magnetic pole layer 15. The magnetic pole portion of the top magnetic pole layer 15 defines the write track width.

According to this embodiment, a magnetic pole of a thin-film magnetic head is formed using the method of frame plating of the first embodiment, and it is therefore possible to form a magnetic pole finer than the dimension determined by an optical limit.

The remainder of the operations and effects of this embodiment are similar to those of the first embodiment.

[Third Embodiment]

Next, a method of forming a magnetic pole of a thin-film magnetic head according to a third embodiment of the invention will now be described. The method according to this embodiment is a method of forming a magnetic pole of a thin-film magnetic head by dry etching using, as a mask, a patterned plating layer formed by the method of frame plating according to the first embodiment.

Reference is now made to FIG. 16A to FIG. 22A and FIG. 16B to FIG. 22B to describe an example of a method of manufacturing a composite thin-film magnetic head by using the method of forming a magnetic pole according to this embodiment. FIG. 16A to FIG. 22A are cross sections each orthogonal to an air bearing surface, and FIG. 16B to FIG. 22B are cross sections each parallel to the air bearing face.

In the method of manufacturing a thin-film magnetic head in this example, steps taken until the insulating layer 14 is formed are the same as those of the second embodiment. Then, in this example, as shown in FIG. 16A and FIG. 16B, a magnetic layer 21 made of a magnetic material is formed on the entire surface in a thickness of, for example, 3 to 5 μm. Examples of the magnetic material used for the magnetic layer 21 include soft magnetic materials with a high saturation magnetic flux density, such as NiFe, CoFe, CoFeNi and FeN. The magnetic layer 21 may be formed by plating or a dry filming method such as sputtering. The magnetic layer 21 corresponds to the layer to be patterned in the present invention.

Next, as shown in FIG. 17A and FIG. 17B, the first resist used in the first embodiment is applied to the magnetic layer 21, and prebaking is performed to form a first resist layer. Next, the first resist layer is exposed to light through a predetermined mask. Thereafter, a baking step in succession to the exposure step, a developing step, a water-washing step and a drying step are carried out in this order to form a first patterned resist layer 22 having an isolated trench. The above drying step may be omitted.

Next, as shown in FIG. 18A and FIG. 18B, the second resist used in the first embodiment is applied to coat the first patterned resist layer 22, thereby forming a second resist layer. Then, the first patterned resist layer 22 and the second resist layer are heat-treated to form a crosslinked film in a portion of the second resist layer near the boundary that touches the first patterned resist layer 22. Next, the second resist is washed with an aqueous isopropanol solution, and then a water-washing step and a drying step are carried out in this order to peel off the non-crosslinked portion of the second resist layer, thereby forming a second patterned resist layer 23 consisting of the crosslinked film. Thus, a frame having a narrowed trench is formed of the first patterned resist layer 22 and the second patterned resist layer 23.

Next, as shown in FIG. 19A and FIG. 19B, using the frame comprising the first patterned resist layer 22 and the second patterned resist layer 23, plating is carried out using the magnetic layer 21 as the base film (seed layer) to form a patterned plating layer 24. Examples of the material used for the patterned plating layer 24 include Ni, NiFe, NiB and NiP.

Then, as shown in FIG. 20A and FIG. 20B, the frame is removed using an organic solvent. Next, as shown in FIG. 21A and FIG. 21B, the magnetic layer 21, the write gap layer 9 and a part of the bottom magnetic pole layer 8 are selectively etched using the patterned plating layer 24 as a mask by dry etching such as ion milling or reactive ion etching. By this process, an top magnetic pole layer 15 is formed by the patterned magnetic layer 21 and a trim structure as shown in FIG. 21B is obtained. Then, the patterned plating layer 24 is removed.

Figures 22A, 22B:
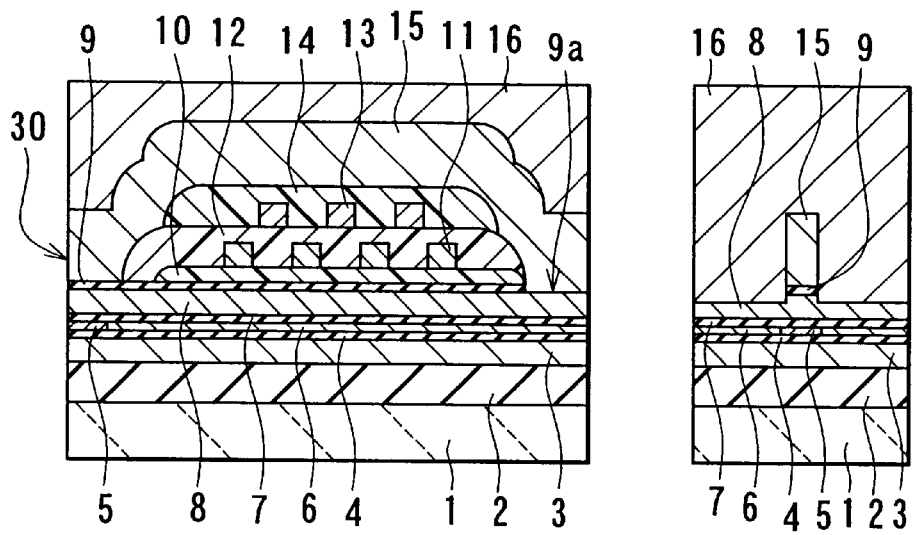
FIG. 22A and FIG. 22B are cross sections for illustrating a step that follows FIG. 21A and FIG. 21B.
Figure 23:
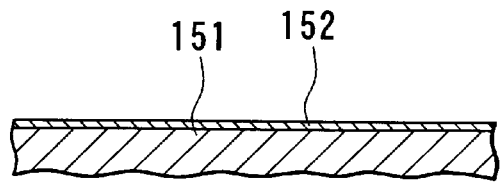
FIG. 23 is a cross section illustrating a step in a method of forming a patterned plating layer carried out in an experiment.
Figure 24:
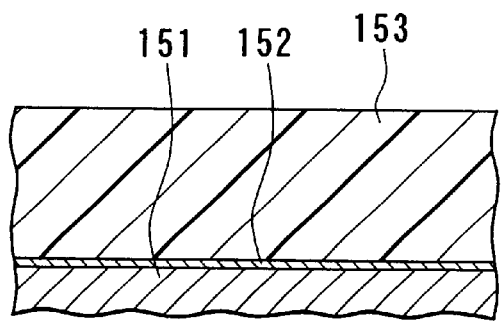
FIG. 24 is a cross section for illustrating a step that follows FIG. 23.
Figure 25:
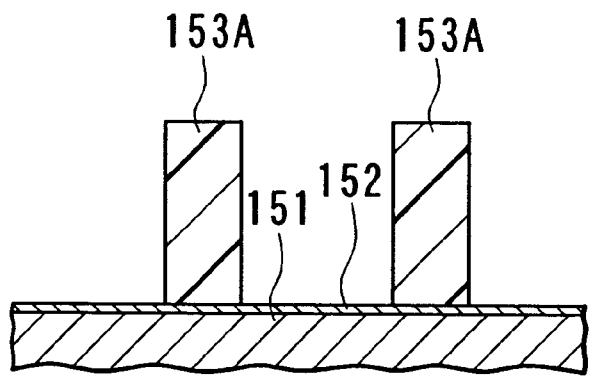
FIG. 25 is a cross section for illustrating a step that follows FIG. 24.
Figure 26:
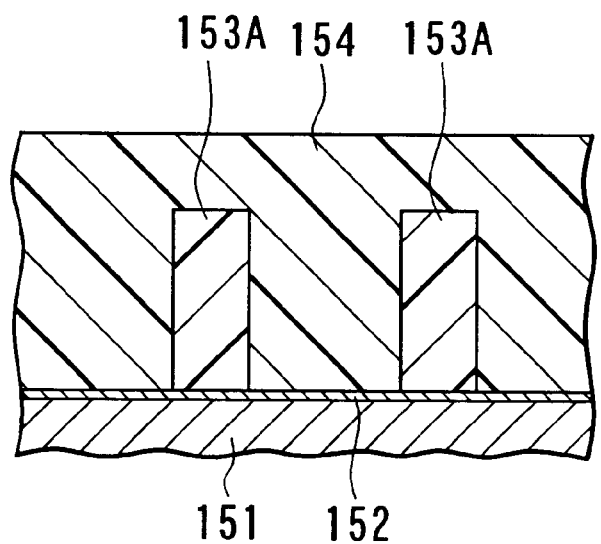
FIG. 26 is a cross section for illustrating a step that follows FIG. 25.
Figure 27:
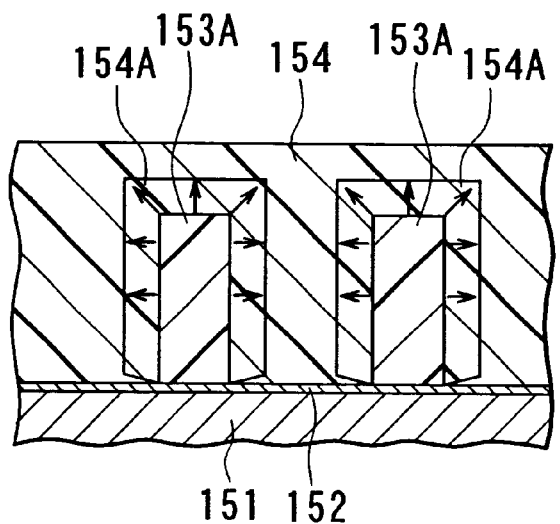
FIG. 27 is a cross section for illustrating a step that follows FIG. 26.
Figure 28:
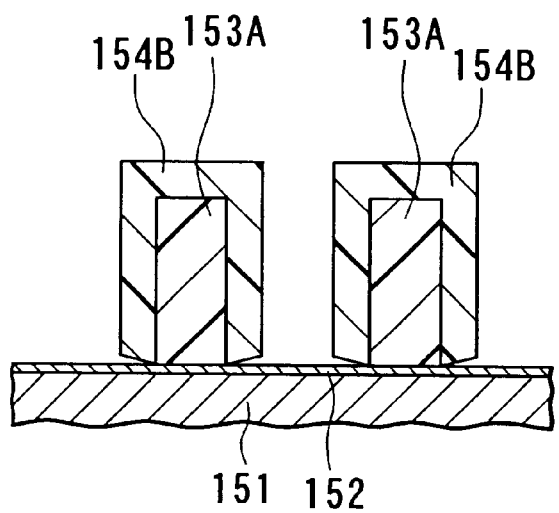
FIG. 28 is a cross section for illustrating a step that follows FIG. 27.
Figure 29:
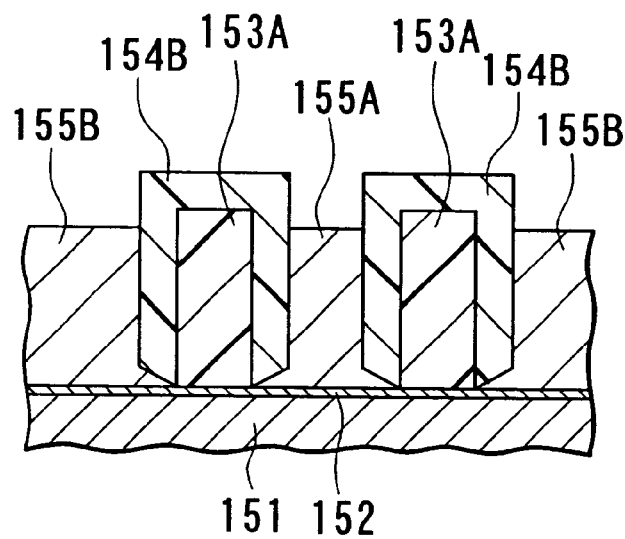
FIG. 29 is a cross section for illustrating a step that follows FIG. 28.
Figure 30:
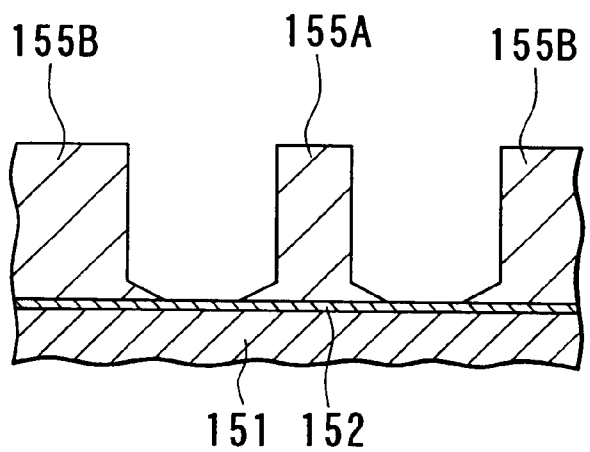
FIG. 30 is a cross section for illustrating a step that follows FIG. 29.
Figure 31:
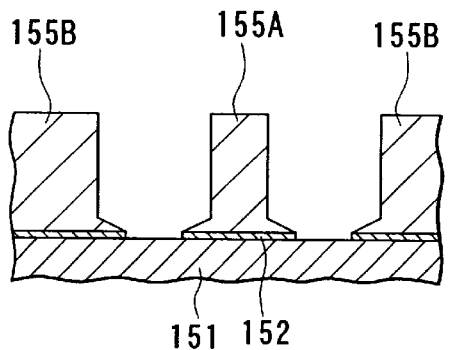
FIG. 31 is a cross section for illustrating a step that follows FIG. 30.
Figure 32:
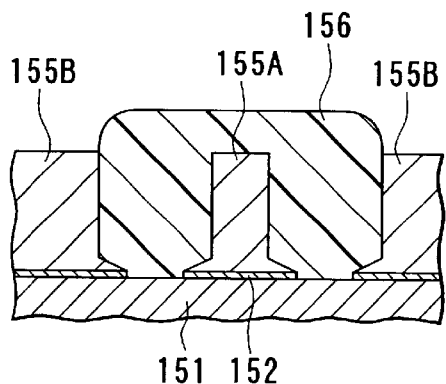
FIG. 32 is a cross section for illustrating a step that follows FIG. 31.
Figure 33:
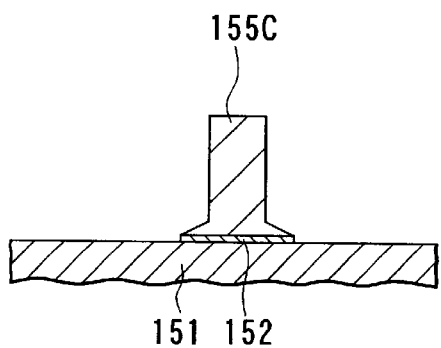
FIG. 33 is a cross section for illustrating a step that follows FIG. 32.

Next, as shown in FIG. 22A and FIG. 22B, the protection layer 16 is formed in the same manner as in the second embodiment. The surface of the protection layer is flattened and pads for electrodes that are not shown are formed on the surface. Finally, lapping of the slider including the foregoing layers is performed to form the air bearing surface 30 of the thin-film magnetic head including the write head and the read head, thereby completing the thin-film magnetic head of this example.

According to the embodiment, a magnetic pole of a thin-film magnetic head is formed by dry etching through the use of, as a mask, the finely patterned plating layer formed using the method of frame plating of the first embodiment. It is therefore possible to form a magnetic pole finer than the dimension determined by an optical limit, similarly to the second embodiment.

The remainder of the configurations, operations and effects of this embodiment are similar to those of the second embodiment.

The present invention is not limited to the aforementioned embodiments and various modifications are possible. For example, the treatment for generating an acid in the first patterned resist layer is not limited to the heat treatment but may be exposure treatment.

The method of frame plating according to the invention is not limited to formation of the top magnetic pole layer that defines the write track width of the thin-film magnetic head, but may be employed to form the bottom magnetic pole layer. If the top or bottom magnetic pole layer includes two or more layers, the method of frame plating of the invention may be applied not only to formation of the layer of the top or bottom magnetic pole layer including the magnetic pole portion, but to formation of layers not including the magnetic pole portion. Furthermore, the method of frame plating of the invention may be applied not only to formation of a magnetic pole layer of the thin-film magnetic head, but to formation of various sorts of patterned plating layers.

The invention may be applied to a thin-film magnetic head dedicated to writing that has an induction-type electromagnetic transducer only or to a thin-film magnetic head performing writing and reading through an induction-type electromagnetic transducer.

As described above, the method of frame plating according to the invention makes it possible to form a fine frame free from the occurrence of disorders during plating in the step of forming the frame, and, through the use of the frame, it is possible to form a plating layer patterned more finely than the dimension determined by an optical limit.

Also, according to the first method of forming a magnetic pole of a thin-film magnetic head of the invention, it is possible to form a magnetic pole finer than the dimension determined by an optical limit, through the use of the method of frame plating of the invention.

Further, according to the second method of forming a magnetic pole of a thin-film magnetic head of the invention, it is possible to form a fine mask for etching through the use of the method of frame plating of the invention, and it is therefore possible to form, using the mask, a magnetic pole finer than the dimension determined by an optical limit.

Obviously many modifications and variations of the present invention are possible in the light of the above teachings. It is therefore to be understood that within the scope of the appended claims the invention may be practiced otherwise than as specifically described.

What is claimed is:

1. A method of frame plating comprising a step of forming a frame using a resist and a step of performing plating by using said frame to form a patterned plating layer, said step of forming the frame including: a step of forming a first patterned resist layer by using a first resist containing a material generating an acid; and a step of forming a second patterned resist layer by coating said first patterned resist layer with a second resist capable of entering into a crosslinking reaction in the presence of an acid, generating an acid in the first patterned resist layer, forming a crosslinked film in a portion of the second resist near the boundary that touches the first patterned resist layer, and peeling off non-crosslinked portions of the second resist, wherein said frame is formed using said first patterned resist layer and said second patterned resist layer; and said first resist comprises the following compounds (A) to (D):

(A) an organic solvent;
(B) a base resin comprising a high molecular compound shown in the following formula (1), the compound having a weight average molecular weight of 10000 to 25000 and a molecular weight distribution of as narrow as 1.05 to 1.25:

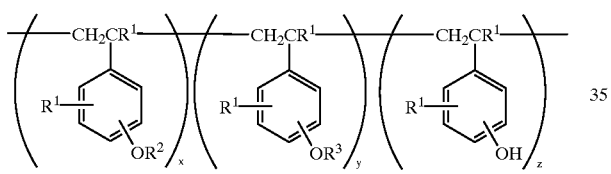

(1)

wherein $R^1$ represents a hydrogen atom or a methyl group, $R^2$ represents a group represented by the following formula (2), $R^3$ represents an acid-unstabilizing group different from $R^2$:

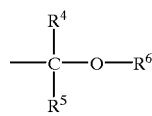

(2)

wherein $R^4$ and $R^5$ each independently represent a hydrogen atom or a straight chain or branched alkyl group having 1 to 6 carbon atoms, $R^6$ represents a straight chain, branched or cyclic alkyl group having 1 to 10 carbon atoms, or $R^4$ and $R^5$, $R^4$ and $R^6$ or $R^5$ and $R^6$ may form a ring, wherein, in the case of forming a ring, $R^4$, $R^5$ and $R^6$ each independently represent a straight chain or branched alkylene group having 1 to 6 carbon atoms, x and y respectively denote 0 or a positive number provided that x and y are not 0 at the same time, and z denotes a positive number wherein the following relationships are established between x, y and z: $0 \leq x/(x+y+z) \leq 0.5$, $0 \leq y/(x+y+z) \leq 0.5$ and $0.4 \leq z/(x+y+z) \leq 0.9$;

(C) an acid generating agent; and (D) an aromatic compound having a group given by the formula $\equiv$C—COOH in its molecule.

2. A method of frame plating according to claim 1, wherein $R^3$ in the formula (1) is —CO$_2$C(CH$_3$)$_3$.

3. A method of forming a magnetic pole of a thin-film magnetic head provided for forming a layer including a magnetic pole portion, the thin-film magnetic head comprising: a medium facing surface that faces toward a recording medium; a first magnetic layer and a second magnetic layer magnetically coupled to each other and including magnetic pole portions opposed to each other and placed in regions of the magnetic layers on a side of the medium facing surface, each of the magnetic layers including at least one layer; a gap layer provided between the magnetic pole portions of the first and second magnetic layers; and a thin-film coil at least a part of which is placed between the first and second magnetic layers, the at least part of the coil being insulated from the first and second magnetic layers; the method including the steps of:

forming a frame using a resist; and forming the layer including the magnetic pole portion by performing plating through the use of said frame, said step of forming the frame including: a step of forming a first patterned resist layer by using a first resist containing a material generating an acid; and a step of forming a second patterned resist layer by coating said first patterned resist layer with a second resist capable of entering into a crosslinking reaction in the presence of an acid, generating an acid in the first patterned resist layer, forming a crosslinked film in a portion of the second resist near the boundary that touches the first patterned resist layer, and peeling off non-crosslinked portions of the second resist, wherein said frame is formed using said first patterned resist layer and said second patterned resist layer; and said first resist comprises the following compounds (A) to (D):

(A) an organic solvent;
(B) a base resin comprising a high molecular compound shown in the following formula (1), the compound having a weight average molecular weight of 10000 to 25000 and a molecular weight distribution of as narrow as 1.05 to 1.25:

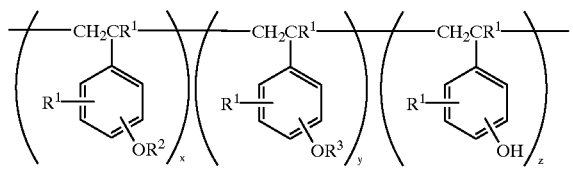

(1)

wherein $R^1$ represents a hydrogen atom or a methyl group, $R^2$ represents a group represented by the following formula (2), $R^3$ represents an acid-unstabilizing group different from $R^2$:

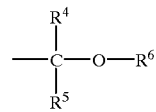

(2)

wherein $R^4$ and $R^5$ each independently represent a hydrogen atom or a straight chain or branched alkyl group having 1 to 6 carbon atoms, $R^6$ represents a straight chain, branched or cyclic alkyl group having 1 to 10 carbon atoms, or $R^4$ and $R^5$, $R^4$ and $R^6$ or $R^5$ and $R^6$ may form a ring, wherein, in the case of forming a ring, $R^4$, $R^5$ and $R^6$ each independently represent a straight chain or branched alkylene group having 1 to 6 carbon atoms, x and y respectively denote 0 or a positive number provided that x and y are not 0 at the same time, and z denotes a positive number wherein the following relationships are established between x, y and z: $0 \leq x/(x+y+z) \leq 0.5$, $0 \leq y/(x+y+z) \leq 0.5$ and $0.4 \leq z/(x+y+z) \leq 0.9$;

(C) an acid generating agent; and (D) an aromatic compound having a group given by the formula $\equiv$C—COOH in its molecule.

4. A method of forming a magnetic pole of a thin-film magnetic head according to claim 3, wherein $R^3$ in the formula (1) is —$CO_2C(CH_3)_3$.

5. A method of forming a magnetic pole of a thin-film magnetic head provided for forming a layer including a magnetic pole portion, the thin-film magnetic head comprising: a medium facing surface that faces toward a recording medium; a first magnetic layer and a second magnetic layer magnetically coupled to each other and including magnetic pole portions opposed to each other and placed in regions of the magnetic layers on a side of the medium facing surface, each of the magnetic layers including at least one layer; a gap layer provided between the magnetic pole portions of the first and second magnetic layers; and a thin-film coil at least a part of which is placed between the first and second magnetic layers, the at least part of the coil being insulated from the first and second magnetic layers; the method including the steps of:

forming a layer to be patterned, which will be formed into the layer including the magnetic pole portion;

forming a mask for etching on said layer to be patterned; and forming said layer including the magnetic pole portion by patterning said layer to be patterned through dry etching using said mask, said step of forming the mask including a step of forming a frame using a resist and a step of performing plating by using said frame to form said mask, said step of forming the frame including: a step of forming a first patterned resist layer by using a first resist containing a material generating an acid; and a step of forming a second patterned resist layer by coating said first patterned resist layer with a second resist capable of entering into a crosslinking reaction in the presence of an acid, generating an acid in the first patterned resist layer, forming a crosslinked film in a portion of the second resist near the boundary that touches the first patterned resist layer, and peeling off non-crosslinked portions of the second resist, wherein said frame is formed using said first patterned resist layer and said second patterned resist layer; and said first resist comprises the following compounds (A) to (D):

(A) an organic solvent;

(B) a base resin comprising a high molecular compound shown in the following formula (1), the compound having a weight average molecular weight of 10000 to 25000 and a molecular weight distribution of as narrow as 1.05 to 1.25:

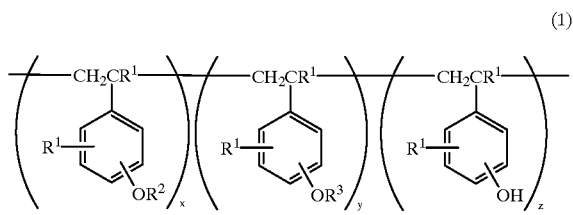

(1)

wherein $R^1$ represents a hydrogen atom or a methyl group, $R^2$ represents a group represented by the following formula (2), $R^3$ represents an acid-unstabilizing group different from $R^2$:

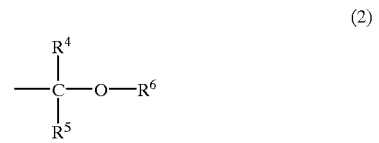

(2)

wherein $R^4$ and $R^5$ each independently represent a hydrogen atom or a straight chain or branched alkyl group having 1 to 6 carbon atoms, $R^6$ represents a straight chain, branched or cyclic alkyl group having 1 to 10 carbon atoms, or $R^4$ and $R^5$, $R^4$ and $R^6$ or $R^5$ and $R^6$ may form a ring, wherein, in the case of forming a ring, $R^4$, $R^5$ and $R^6$ each independently represent a straight chain or branched alkylene group having 1 to 6 carbon atoms, x and y respectively denote 0 or a positive number provided that x and y are not 0 at the same time, and z denotes a positive number wherein the following relationships are established between x, y and z: $0 \leq x/(x+y+z) \leq 0.5$, $0 \leq y/(x+y+z) \leq 0.5$ and $0.4 \leq z/(x+y+z) \leq 0.9$;

(C) an acid generating agent; and (D) an aromatic compound having a group given by the formula $\equiv$C—COOH in its molecule.

6. A method of forming a magnetic pole of a thin-film magnetic head according to claim 5, wherein $R^3$ in the formula (1) is —$CO_2C(CH_3)_3$.

* * * * *